United States Patent [19]
Schubert et al.

[11] Patent Number: 5,951,886
[45] Date of Patent: Sep. 14, 1999

[54] APPARATUS FOR ELECTRON BEAM WELDING AT ATMOSPHERIC PRESSURE

[75] Inventors: Guenther G. Schubert, Longmeadow, Mass.; Joseph L. Lovett, Marlborough, Conn.

[73] Assignee: PTR Precision Technologies, Enfield, Conn.

[21] Appl. No.: 08/998,135

[22] Filed: Dec. 23, 1997

[51] Int. Cl.⁶ .................................................. B23K 15/10
[52] U.S. Cl. ................................ 219/121.13; 219/121.24
[58] Field of Search .................. 219/121.13, 121.12, 219/121.24, 121.33, 121.27

[56] References Cited

U.S. PATENT DOCUMENTS

| | | | |
|---|---|---|---|
| 3,162,749 | 12/1964 | Peracchio | 219/121.24 |
| 3,171,943 | 3/1965 | Niedzielski . | |
| 3,219,792 | 11/1965 | Pederson | 219/121.24 X |
| 3,428,776 | 2/1969 | Stauffer | 219/121.24 X |
| 3,444,350 | 5/1969 | Niedzielski et al. . | |
| 3,585,348 | 6/1971 | Eckstein | 219/121.13 |
| 3,585,349 | 6/1971 | Kalbfell | 219/121.13 |
| 3,602,686 | 8/1971 | LEmpert | 219/121.24 X |
| 4,304,979 | 12/1981 | Dietrich et al. | 219/121.13 |
| 4,393,295 | 7/1983 | Beisswenger et al. . | |
| 4,607,167 | 8/1986 | Petric | 219/121.24 X |
| 4,792,688 | 12/1988 | Young | 219/121.24 X |

FOREIGN PATENT DOCUMENTS 56-56791   5/1981   Japan .

*Primary Examiner*—Gregory Mills
*Attorney, Agent, or Firm*—Milde, Hoffberg & Macklin, LLP

[57] ABSTRACT

Electron beam is focussed in a focussing column in a high vacuum environment and emitted downward through upper, middle, and lower orifices. A second stage vacuum housing concentrically surrounds a lower portion of the beam focussing column and separates the upper and middle orifices. A first stage vacuum housing concentrically surrounds the second stage vacuum housing and separates the middle and lower orifices. An outer wall surrounding the second housing tapers downward to the lower orifice, allowing it to be positioned as closely as desired to a workpiece regardless of surface topography. The apparatus comprises an orifice housing having an internal cavity which receives the lower part of the beam focussing column, an inner wall which defines the outer boundary of the second housing, and a support spool borne against by the outer wall, which is fixed to the bottom of the orifice housing and fixes the other components relative to each other in the housing.

16 Claims, 3 Drawing Sheets

APPARATUS FOR ELECTRON BEAM WELDING AT ATMOSPHERIC PRESSURE

BACKGROUND OF THE INVENTION

The present invention relates to an apparatus for performing operations such as welding, cutting, evaporating, engraving or machining or other surface modification of any material with an electron beam. More particularly, the invention relates to an electron beam welder for welding a workpiece in a non-vacuum environment.

Electron guns for generating focussed, high energy electron beams are well known. In order to prevent electrons from colliding with gas molecules, which causes the beam to disperse, the beam is generated in a vacuum. This is also necessary to prevent arcing in the gun region and to increase the life of the cathode. Likewise, the workpiece to be welded or otherwise operated on by the electron beam is preferably located in an evacuated environment. Since beam dispersion decreases with lower pressure, the distance between the gun assembly and the workpiece may be increased. However, the welding of workpieces in a reduced pressure environment requires evacuating the workpiece chamber each time a new workpiece or batch of workpieces is introduced or necessitates that some form of pressure lock scheme be employed for providing continuous part throughput.

Electron beam welding in a non-vacuum environment offers the advantage of eliminating the workpiece chamber and the necessity of repeated evacuation; the size of the workpiece is not limited by the size of a chamber, and continuous welding is possible. However, the distance between the electron beam generator and the workpiece must be kept to a minimum, and a sequential series of vacuum stages separated by orifices is necessary.

U.S. Pat. Nos. 4,304,979 and 4,393,295 disclose electron beam generators for operating on workpieces in a non-vacuum environment. Each generator has three vacuum stages, including a first stage next to a lower orifice from which the beam exits, a second or intermediate stage connected to the first stage via a middle orifice, and a high vacuum stage connected to the second stage via an upper orifice. The electron beam is generated in the high vacuum stage, and then passes through the axially aligned orifices, which are as small as possible in order to limit influx of air along the beam path.

U.S. Pat. Nos. 3,171,943 and 3,444,350 disclose electron beam generators for operating on workpieces in a non-vacuum environment, and address the problem of beam attenuation by pumping a high pressure stream of gas across the exit orifice to deflect any incoming air.

FIG. 1 depicts a prior art electron beam welding apparatus for welding a workpiece in a non-vacuum environment. This particular apparatus is sold by PTR-Precision Technologies of Enfield, Conn. The exterior of the apparatus pictured is formed by lead shrouding 2 with an access door 4 for access to the electron gun assembly 12 positioned in high vacuum housing 6. The housing 6 is formed by an upper section 8, a middle section 9, and a lower section 10. A high voltage cable 13 is connected to the gun through an insulated cable socket 14 extending into a cavity formed in the upper and middle housing sections.

An electron beam generated by the gun assembly is directed downward along an axial path through a focussing column 16 which is surrounded by a beam alignment coil 18 and a focussing coil 20 situated in the lower section 10 of the high vacuum housing. The column 16 is formed by an upward extension of an orifice housing 22 which houses the orifices 24, 25, 26 separating sequential vacuum stages from the outside environment. The highest vacuum ends at upper orifice 24 at the lower end of the focussing column 16. This is followed by a second or intermediate stage vacuum duct 30, whence the beam passes through middle orifice 25 into first stage vacuum duct 28, and finally exits through lower orifice or nozzle 26 to the ambient environment.

The first stage duct 28 is evacuated by a first stage pumping line 29, while the second stage duct 30 is evacuated by a second stage pumping line 31. The degree of vacuum increases, i.e., the pressure drops, between the first stage duct 28 and the cavity in the high vacuum housing 6, which is evacuated by a separate line (not shown). Since the electron beam emerges from an orifice 26 between a vacuum and a non-vacuum environment, air molecules tend to rush in along the path of the beam, causing dispersion. This influx of air is diverted somewhat by a jet of air which is propelled laterally from the external airjet 32 across the lower orifice.

All of the cited prior art electron beam welders have flat surfaces in the vicinity of the beam exit orifice, which makes them suitable only for readily accessible weld joints. For joints which are difficult to access, the distance between the exit orifice and the workpiece would be too large, and scattering of the electrons would result due to the presence of too many intervening air molecules.

SUMMARY OF THE INVENTION

According to the invention, an electron beam generator generates a beam of electrons in a high vacuum housing and directs it downward along an axial path through a beam focussing column to an upper orifice. A second stage vacuum duct concentrically surrounds the lower portion of the beam focussing column and extends downward to a middle orifice on the axial path. A first stage vacuum duct concentrically surrounds the second stage vacuum duct and tapers down to a lower orifice from which the beam exits.

According to a preferred embodiment, the second stage vacuum duct is defined by an inner wall shaped substantially as an inverted cone with an apex proximate to the middle orifice, and the first stage vacuum duct is defined by an outer wall shaped substantially as an inverted cone with an apex proximate to the lower orifice. The tapered shape of the outer wall permits a close positioning of the exit orifice to the workpiece being welded, whereby the beam path through the atmosphere may be kept to a minimum. For large irregularly shaped surfaces, the electron beam generator may be robotically controlled for XYZ movement. Alternatively, the workpiece may be subjected to XYZ movement.

The apparatus according to the invention constitutes a cartridge style of design that provides for ease of assembly and disassembly, so that components, in particular the orifices, may be readily replaced. The central feature which makes this possible is an orifice housing which is fixed to the high vacuum housing. The orifice housing has a cavity which receives a lower portion of the focussing column and the inner wall; these components are held in place by the outer wall, which is fixed to the orifice housing. The upper, middle, and lower orifice are retained in the respective lower column portion, inner wall, and outer wall.

The outer wall has incorporated therein a conduit for providing air for an injection jet which injects the air into the axial path in the first stage vacuum duct. It also has conduits for carrying coolant to the lower orifice assembly, which can be heated by the welding. An additional conduit provides helium to a blowdown plenum in the lower orifice assembly.

This not only attenuates inflowing air, but provides an inert gas shielding effect at the welding site and deflects vaporized and spattered material which may deposit on the lower orifice.

DETAILED DESCRIPTION OF THE PREFERRED EMBODIMENTS

Figure 1:
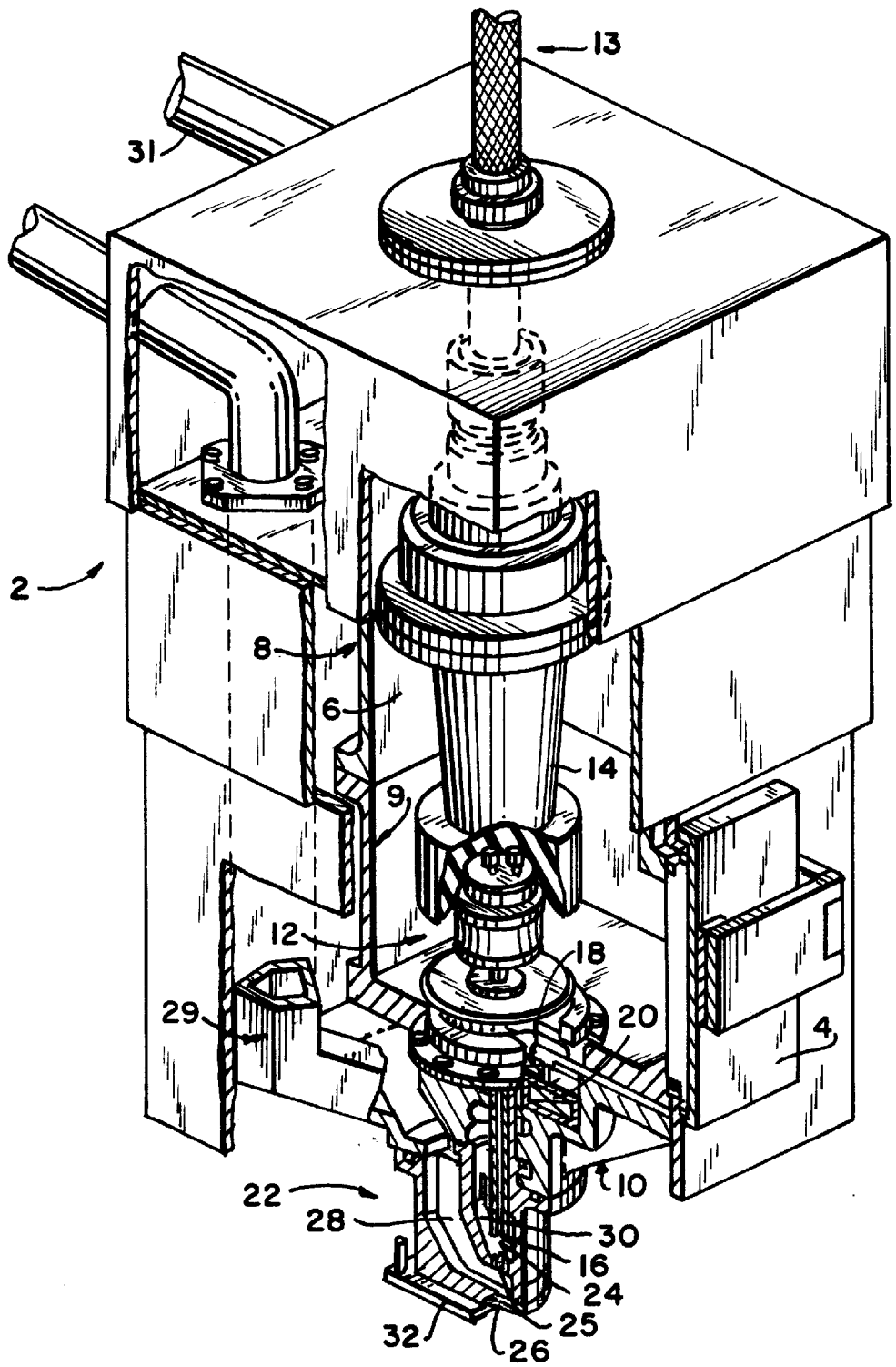
FIG. 1 is a cutaway perspective view of a prior art non-vacuum electron beam welding apparatus.
Figure 2:
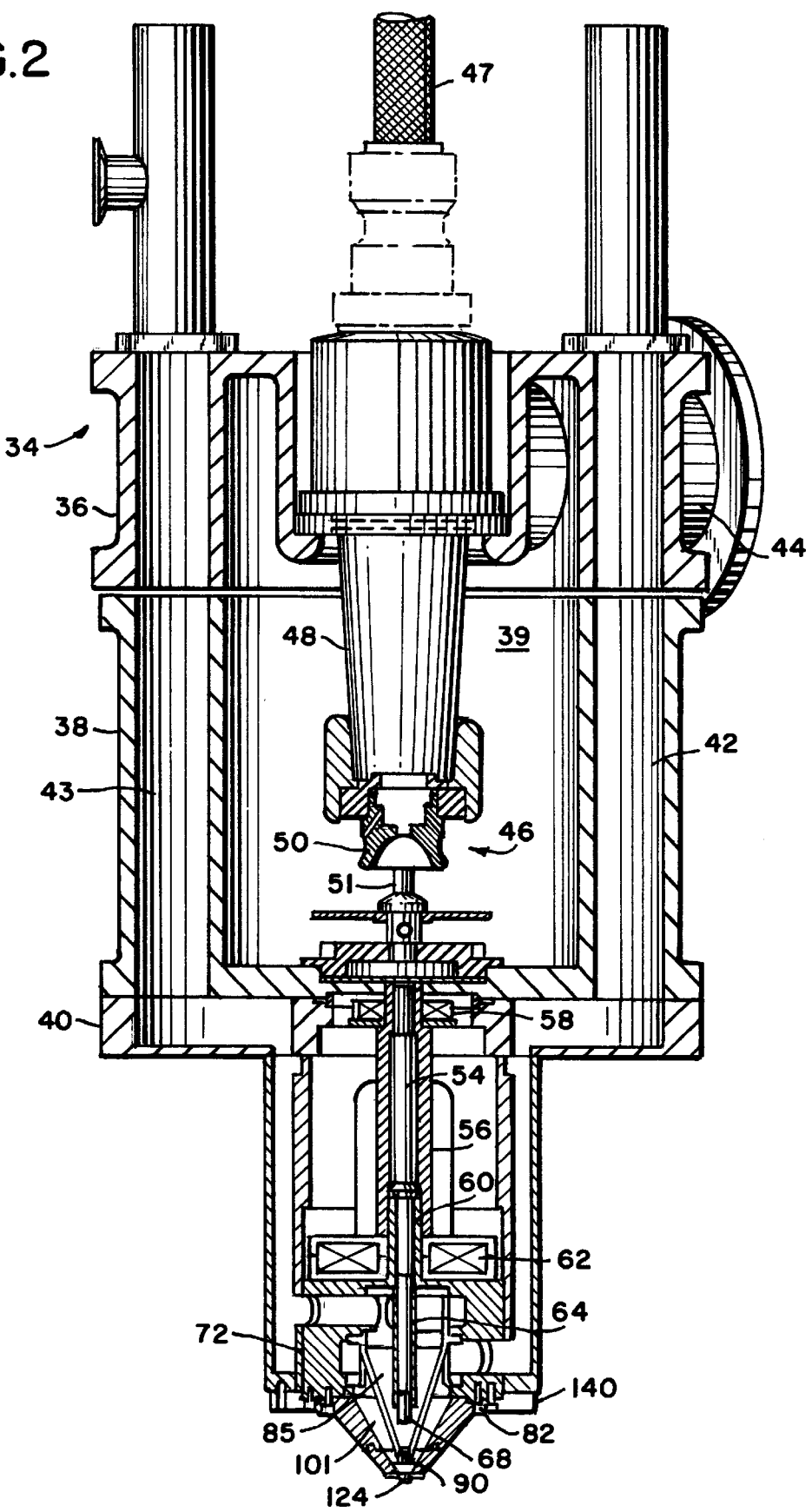
FIG. 2 is an axial cross-section of the apparatus according to the invention.

FIG. 2 is an axial cross section of the electron beam welding apparatus of the present invention; any required lead shrouding would be essentially the same as the prior art apparatus of FIG. 1 and has been deleted for clarity.

A high vacuum housing 34 is formed by an upper section 36, a middle section 38, and a lower section 40, and incorporates a first stage pumping line 42, a second stage pumping line 43, and a high vacuum pumping line 44. The line 44 is used to evacuate a cavity 39 which houses the electron gun assembly 46; the assembly is powered by a high voltage cable 47 received through an insulator 48 in the upper housing section 36. The gun is a conventional design which includes a grid cup 50 and an anode 51 which accelerates the beam downward through a beam focussing column 54, purposely lengthened to improve the system's beam focusing capacity, formed by an upper portion 56, a middle portion 60, and a lower portion 64. The upper portion 56 is a discrete piece received concentrically within the lower section 40 of the high vacuum housing 34, and is surrounded at its upper end by a deflection coil 58 which is used for beam alignment. The middle portion 60 is formed as an integral extension of orifice housing 72, and is surrounded by a focussing coil 62 in the lower housing section 40. The upper end of middle portion 60 is received concentrically within the lower end of the upper portion 56, and is provided with an O-ring seal. The lower portion 64 of beam focussing column 54 is received in a cavity 73 of the orifice housing 72, as will be described in detail in conjunction with FIG. 3.

The orifice housing 72 is fixed to the high vacuum housing 34 by a retaining ring 140, and encloses a first stage vacuum duct 101 and a second stage vacuum duct 85, which are evacuated by respective pumping lines 42 and 43. The electron beam focussed within the column 54 passes through an upper orifice 68, a middle orifice 90, and a lower orifice 124 as it passes from the high vacuum of the focussing column to the atmosphere below the lower orifice 124, where a workpiece (not shown) is positioned in close proximity.

Figure 3:
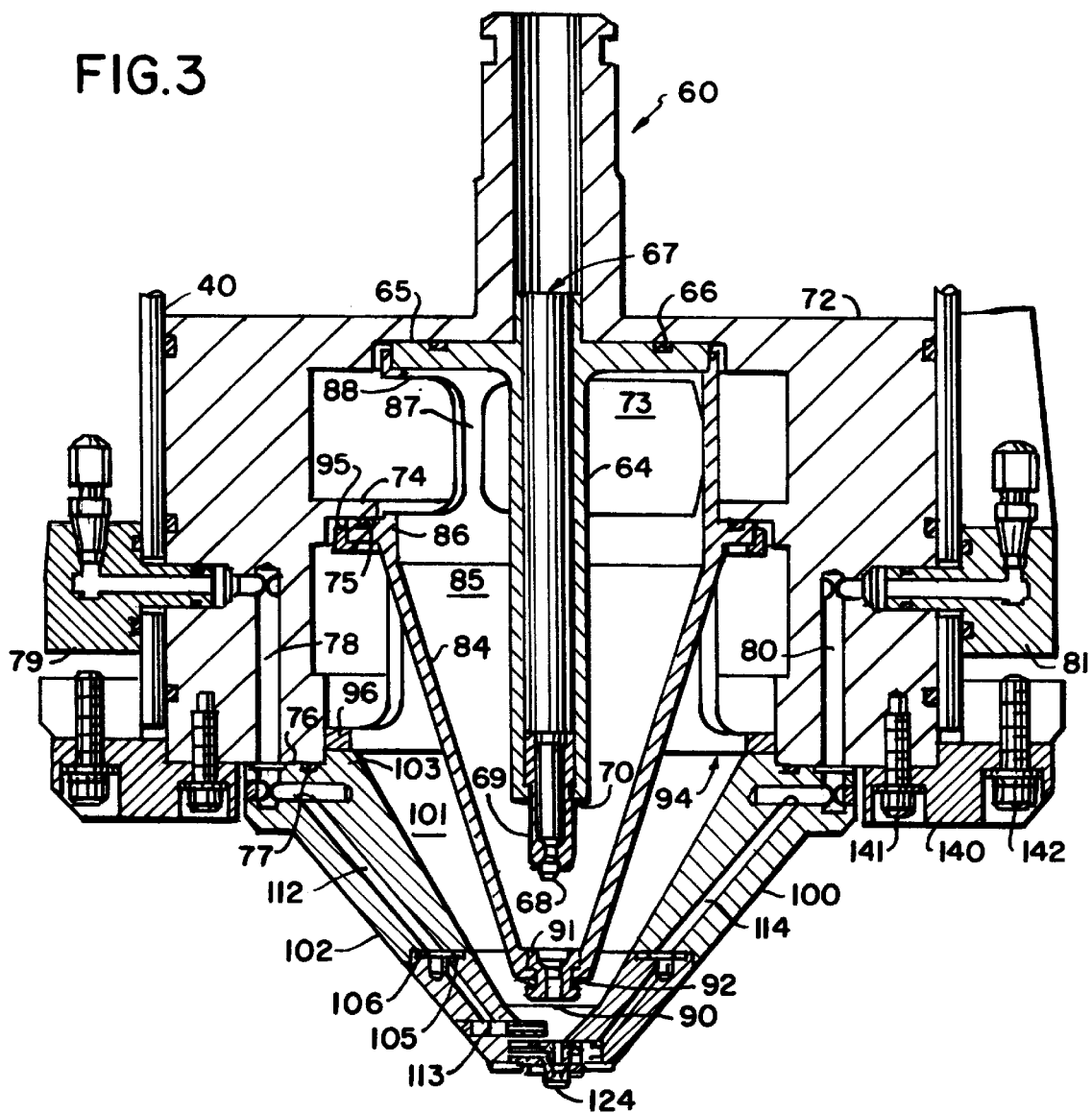
FIG. 3 is a detailed axial cross-section of the orifice housing and the vacuum ducts.

Referring to FIG. 3, the vacuum duct configuration of the present invention is shown in greater detail. The lower portion 64 of the beam focussing column has a flange 65 which is received against the inside of the orifice housing 72 with a seal 66, a stem 67 being received inside the middle portion 60, which is formed as an extension of housing 72. The electron beam travels on a beam path axially centered in the focussing column and exits through an upper orifice 68 at the lower end of column portion 64. The orifice 68 is machined in a block 69 which is retained in the column by a bowed retaining ring 70 received in an annular channel on the block 69.

The second stage vacuum duct 85 is defined by an inner wall 84 which concentrically surrounds the lower portion 64 of the beam focussing column. The inner wall 84 has a base flange 86 which is received against an intermediate flange 74 of the orifice housing 72 with a seal 75 therebetween. Extending integrally upward from the base flange 86 are circumferential ribs 87 which support an upper flange 88. The upper flange 88 holds the flange 65 of the focussing column in place, and the space between flanges 86 and 88 provides a port for the second stage pumping line. The inner wall 84 is shaped substantially as an inverted cone with an apex proximate to the middle orifice 90. The orifice 90 is machined in a block 91 which is retained in the inner wall 84 by a bowed retaining ring 92 received in an annular channel on the block 91.

Figure 3A:
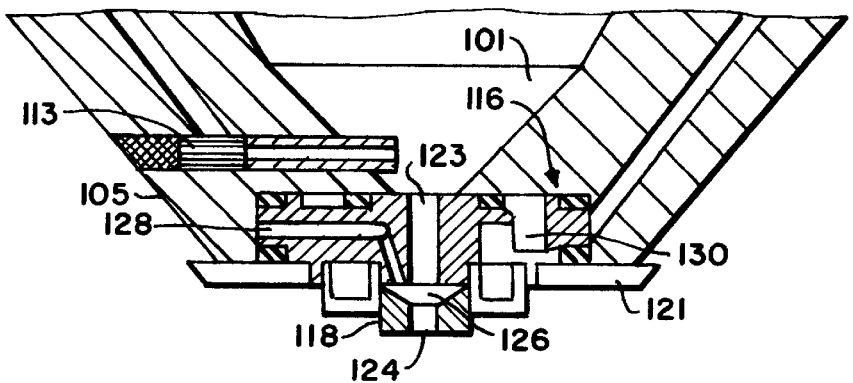
FIG. 3A is a detailed axial cross-section of the lower orifice assembly.

The first stage vacuum duct 101 is defined by an outer wall 100 which concentrically surrounds the inner wall 84. The outer wall 100 is formed by an upper portion 102 and a lower portion 105 which are collectively shaped substantially as an inverted cone having an apex proximate to lower orifice 124. The upper portion 102 has a base 103 which is received against lower face 76 of orifice housing 72 with seal 77 therebetween. The lower portion 105 is received against the upper portion 102 with a seal 106 therebetween, and serves as an adapter for the lower orifice assembly (FIG. 3A). The outer wall as a whole is retained against the orifice housing 72 by means of bolts 82 (visible in FIG. 2). The retaining ring 140 fixes the orifice housing 72 to the lower vacuum housing 40 by means of bolts 141 and 142.

A support spool 94 fitted between the base 103 of the outer wall 100 and the base 86 of the inner wall 84 serves to fix the position of the inner wall 84, which in turn fixes the position of the lower portion 64 of the beam focussing column and the upper orifice 68. The support spool is formed by an upper annular flange 95 and a lower annular flange 96 separated by circumferential support ribs 97.

The outer wall 100 contains an air conduit 112 which extends from the base 103 to an air injection jet 113 extending into the first stage vacuum duct 101 in the area of lower portion 105. The conduit 112 connects with an air passage 78 in the orifice housing 72, which is provided with a fitting 79. This admits air to the jet 113 from a remote location where it is not apt to be contaminated. The jet 113 shoots a fine stream of molecules through the beam path and thus deflects and disperses any stream of gas which may be incoming from the lower orifice 124.

The outer wall 100 further contains a coolant conduit 114 which connects to a coolant passage 80 in the orifice block 72, which is provided with a fitting 81. Coolant is thus provided to the lower orifice assembly 116, which may be heated by welding in the immediate vicinity.

FIG. 3A contains a detail of the lower orifice assembly 116, which includes an orifice block 118 having an axial passage 123 on the beam path to the lower orifice 124. The passage 123 includes a plenum 126 for helium blowdown, i.e., admitting helium via inlet 128 in order to displace the heavier air molecules. The plenum 126 tapers downward toward the orifice 124, and thus forces helium to exit coaxially with the beam against the incoming air. Helium not only provides less resistance to passage of electrons than air at the same pressure, but further provides an inert gas shield at the welding site and serves to prevent deposition of welding debris on the orifice. A more complete explanation of the advantages of using helium may be found in U.S. Pat. No. 3,585,349. The block 118 includes coolant passages 130 connected to the conduit 114, which actually includes two conduits (one is not shown) in order to complete a cooling loop. The block 118 is provided with appropriate seals 121 and is held in place by a retaining disk 120.

The foregoing is exemplary and not intended to limit the scope of the claims which follow. While an electron beam welder has been described, it will be clear that the principles of the invention may be applied to apparatus for other processing of materials at atmospheric pressure.

We claim:

1. Electron beam processing apparatus for welding a workpiece in a non-vacuum environment, said apparatus comprising, in combination:

a high vacuum housing, an electron beam generator which generates an electron beam in said high vacuum housing, a beam focusing column which receives said electron beam and directs it along an axial path from said high vacuum housing to an outer portion of said column, said outer portion having an initial orifice on said axial path, a second stage vacuum housing concentrically surrounding said outer portion of said column, said second stage vacuum housing extending outward along said axial path to a middle orifice on said axial path, and a first stage vacuum housing concentrically surrounding said second stage vacuum housing and tapering substantially conically inward along said axial path to an outer orifice positioned on said axial path, whereby said electron beam passes along said axial path through said column, said initial orifice, said middle orifice and said outer orifice into the environment of the workpiece.

2. Electron beam processing apparatus as in claim 1, comprising an inner wall defining at least a portion of said second stage vacuum housing and surrounding said outer portion of said column, said inner wall tapering substantially conically inward along said axial path to said middle orifice.

3. Electron beam processing apparatus as in claim 2, wherein said inner wall is shaped substantially as a cone with an apex proximate said middle orifice.

4. Electron beam processing apparatus as in claim 2, comprising an outer wall defining at least a portion of said first stage vacuum housing and surrounding said inner wall, said outer wall tapering conically inward to said outer orifice.

5. Electron beam processing apparatus as in claim 4, wherein said outer wall is shaped substantially as a cone having an apex proximate said outer orifice.

6. Electron beam processing apparatus as in claim 4, further comprising an air injection jet positioned to inject a stream of air laterally into said axial path between said middle orifice and said outer orifice.

7. Electron beam processing apparatus as in claim 6, further comprising conduit means in said outer wall for supplying air to said jet, said conduit means extending from a base portion of said outer wall to said jet, said base portion on the side being opposite to said outer orifice in relation to said axial path.

8. Electron beam processing apparatus as in claim 4, further comprising an outer orifice assembly comprising an orifice block having an axial passage extending therethrough to said outer orifice, said orifice block being releasably retained against said outer wall.

9. Electron beam processing apparatus as in claim 8, further comprising a helium inlet for supplying helium laterally to said axial passage.

10. Electron beam processing apparatus as in claim 9, further comprising a helium plenum intersected by said axial passage in said orifice block, said helium inlet being connected to said plenum, said plenum tapering substantially conically inward toward said outer orifice.

11. Electron beam processing apparatus as in claim 8, further comprising coolant passage means in said orifice block, and coolant conduit means in said outer wall for supplying coolant to said coolant passage means.

12. Electron beam processing apparatus as in claim 4, comprising an orifice housing having a cavity which receives at least a portion of said outer portion of said column, said inner wall, and said outer wall concentrically about said axial path.

13. Electron beam processing apparatus as in claim 12, wherein said outer wall is retained releasably against said orifice housing, thereby retaining said inner wall and said outer portion of said column in a fixed relative position in said cavity.

14. Electron beam processing apparatus as in claim 13, further comprising a discrete support element fitted between said inner wall and said outer wall.

15. Electron beam processing apparatus as in claim 12, further comprising a first stage pumping line connected to said first stage vacuum housing via said orifice housing.

16. Electron beam processing apparatus as in claim 12, further comprising a second stage pumping line connected to said second stage vacuum housing via said orifice housing.

* * * * *